United States Patent
Sano et al.

(10) Patent No.: US 8,530,596 B2
(45) Date of Patent: Sep. 10, 2013

(54) POLYMER FOR FORMING INSULATING FILM, COMPOSITION FOR FORMING INSULATING FILM, INSULATING FILM, AND ELECTRONIC DEVICE HAVING SAME

(75) Inventors: Yohko Sano, Tokyo (JP); Kazuyoshi Fujita, Tokyo (JP); Sumitoshi Asakuma, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 305 days.

(21) Appl. No.: 12/694,292

(22) Filed: Jan. 27, 2010

(65) Prior Publication Data

US 2010/0130672 A1 May 27, 2010

Related U.S. Application Data

(63) Continuation of application No. PCT/JP2008/064072, filed on Jul. 30, 2008.

(30) Foreign Application Priority Data

Jul. 30, 2007 (JP) ................................. 2007-197482

(51) Int. Cl.
*C09D 5/25* (2006.01)
*C09D 147/00* (2006.01)
*C08F 36/00* (2006.01)
*C08F 38/00* (2006.01)

(52) U.S. Cl.
USPC ........... 526/282; 524/553; 524/554; 438/125; 427/508; 522/2; 522/150; 522/157; 522/158; 522/159

(58) Field of Classification Search
USPC .................. 524/553, 554; 526/282; 438/125; 427/508; 522/2, 150, 157, 158, 159
See application file for complete search history.

(56) References Cited

U.S. PATENT DOCUMENTS

2005/0090596 A1* 4/2005 Apen et al. .................... 524/474
2005/0277751 A1* 12/2005 Satoh et al. ................... 526/282

(Continued)

FOREIGN PATENT DOCUMENTS

EP 1953181 8/2008
EP 2000510 12/2008

(Continued)

OTHER PUBLICATIONS

Extended European Search Report for corresponding EP Application No. 08792238.1-2102, Oct. 6, 2011.

*Primary Examiner* — Mark Kaucher
(74) *Attorney, Agent, or Firm* — Ditthavong Mori & Steiner, P.C.

(57) ABSTRACT

A polymer and composition useful in forming an insulating film provided with a low permittivity, a high heat resistance, and a high mechanical strength and an insulating film obtained from these and an electronic device having the same are provided. The polymer for forming an insulating film according to the present invention is characterized by being obtained by polymerizing a reactive compound represented by Formula (1). The insulating film according to the present invention is formed using a composition for forming an insulating film including that polymer, has molecular spaces having an average space size of 0.7 nm to 5 nm, and has a permittivity of 2.3 or less. The electronic device according to the present invention has the insulating film.

$$X-R_1\!-\!\!\left(R_2\right)_{\!\!n}\!\!-\!R_3-Y \quad (1)$$

(wherein $R_1$, $R_2$, and $R_3$ are the same or different from each other and respectively represent an organic group having a ring structure; X and Y are the same or different from each other and respectively represent an aromatic organic group having a reactive group; and n represents 0 or 1).

6 Claims, 1 Drawing Sheet

(56) References Cited

U.S. PATENT DOCUMENTS

| | | |
|---|---|---|
| 2007/0037941 A1 | 2/2007 | Watanabe |
| 2007/0135585 A1 | 6/2007 | Hiraoka et al. |
| 2007/0255003 A1 | 11/2007 | Watanabe et al. |

FOREIGN PATENT DOCUMENTS

| | | |
|---|---|---|
| EP | 2014636 | 1/2009 |
| EP | 2157107 | 2/2010 |
| JP | 10-077389 | 3/1998 |
| JP | 11-214382 | 8/1999 |
| JP | 2001-247652 | 9/2001 |
| JP | 2001-332543 | 11/2001 |
| JP | 2006-206857 | 8/2006 |
| JP | 2006-241239 | 9/2006 |
| JP | 2006-265513 | 10/2006 |
| JP | 2006-282814 | 10/2006 |
| JP | 2006-282815 | 10/2006 |
| JP | 2007-070597 | 3/2007 |
| JP | 2007-77289 | 3/2007 |
| WO | WO 2007/034902 | 3/2007 |
| WO | WO 2007/111168 | 10/2007 |

\* cited by examiner

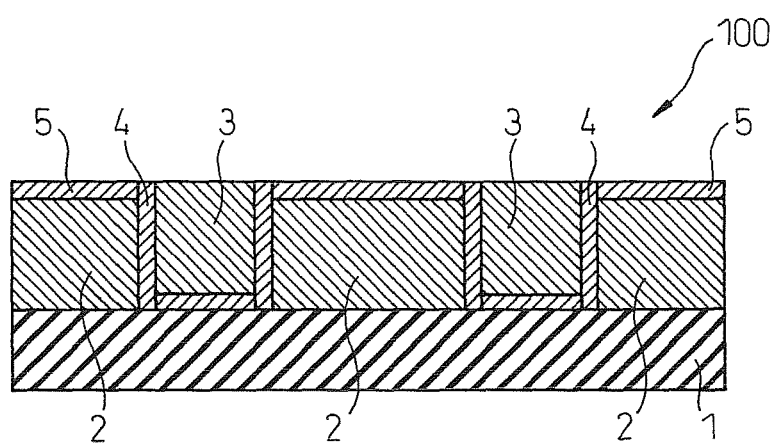

POLYMER FOR FORMING INSULATING FILM, COMPOSITION FOR FORMING INSULATING FILM, INSULATING FILM, AND ELECTRONIC DEVICE HAVING SAME

CROSS-REFERENCE TO RELATED APPLICATION

This application is a continuation of co-pending PCT application No. PCT/JP2008/064072, having an international filing date of Jul. 30, 2008, which claims benefit of JP 2007-197482, filed Jul. 30, 2007, the entire contents of which are hereby incorporated by reference.

TECHNICAL FIELD

The present invention relates to a polymer for forming an insulating film, a composition for forming an insulating film, an insulating film, and an electronic device having the same.

BACKGROUND ART

In recent years, in the field of electronic materials, semiconductor devices have been made increasingly higher in degree of integration, faster in operating speeds, and higher in performance. Along with this, signal delay, considered to be caused by greater interconnect resistance of the semiconductor integrated circuits or greater electrical capacity between interconnects, has become a big problem. In order to solve the problem of the signal delay and to increase the operating speed of semiconductor devices, it is necessary to use a low permittivity material for the insulating film in multi-layer interconnect structures.

In order to decrease the permittivity of an insulating film, techniques such as decreasing the polarity of the material and lowering the density of the insulating film have mainly been studied. For example, as disclosed in Japanese Unexamined Patent Publication No. 2006-265513, in order to decrease the polarity, it is known to use a material which does not include high polarity elements such as nitrogen. Further, as disclosed in Japanese Unexamined Patent Publication No. 11-214382, in order to lower the density, it is known to introduce adamantane or another bulky structure having spaces in the molecule. Further, as disclosed in Japanese Unexamined Patent Publication No. 2001-332543, it is known to polymerize a compound having a three-dimensional structure and a compound having a two-dimensional structure so as to form molecular level pores. Further, as disclosed in Japanese Unexamined Patent Publication No. 2006-265513 above, it is known to use a pore forming agent to make a film porous. Further, as disclosed in Japanese Unexamined Patent Publication No. 2007-77289, it is known to use a composition including microparticles to form a film and thereby form a porous film.

However, a material obtained by using a pore forming agent to make a film porous exhibits a film permittivity of 2.2 or a lower value, but the mechanical strength is low and the pores are easily infiltrated by metals, various chemicals, etc. This is becoming a major problem in terms of reliability of semiconductor devices. Further, there are materials decreased in density without using a pore forming agent by introducing an adamantine-like structure and materials not including high polarity elements such as nitrogen where the permittivity is reduced to a value of over the 2.3 level, however, a permittivity 2.3 or less sought in the field of semiconductors has not been realized. In materials polymerizing two (or more) compounds and forming molecular level pores, explained above as another example, there are materials where the permittivity is 2.3 or less, but a reaction for polymerizing a plurality of compounds is based on an acid-base reaction or the like, so the material obtained by this is poor in storage stability. Further, depending on the reaction conditions (film-forming conditions), the degree of progress and uniformity of the reaction differ, so there was a problem that obtaining stable film properties was difficult. Further, forming a film from a composition including nanometer level particles to thereby form a porous low permittivity film is the same nano-structurally as using a pore forming agent to make a film porous. Further, the composition (coating solution) has particles dispersed in it, so the solid contents tend to precipitate due to the agglomeration of the particles and therefore the storage stability is inferior.

DISCLOSURE OF THE INVENTION

The present invention, in view of this situation, has as its object to provide a polymer and a composition useful for forming an insulating film provided with a low permittivity, a high heat resistance, and a high mechanical strength, an insulating film obtained from the same, and an electronic device having the same.

That is, the present invention is achieved by (1) to (8):
(1) A polymer for forming an insulating film obtained by polymerizing a reactive compound represented by Formula (1):

(wherein $R_1$, $R_2$, and $R_3$ are the same or different from each other and respectively represent an organic group having a ring structure; X and Y are the same or different from each other and respectively represent an aromatic organic group having a reactive group; and n represents 0 or 1).

(2) The polymer for forming an insulating film according to (1), wherein at least one of $R_1$, $R_2$, and $R_3$ of Formula (1) is an organic group having a cage structure.

(3) The polymer for forming an insulating film according to (1) or (2), wherein the reactive compound is represented by Formula (2) or (3) below:

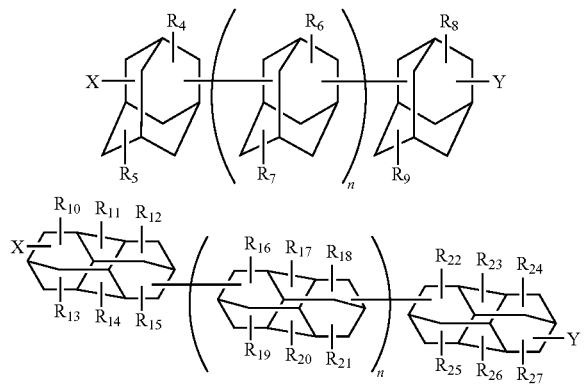

(wherein $R_4$ to $R_{27}$ respectively represent hydrogen or an organic group, X and Y are the same or different from each other and respectively represent an aromatic organic group having a reactive group; and n represents 0 or 1).

(4) The polymer for forming an insulating film according to any one of (1) to (3), wherein reactive groups of X and Y of Formula (1) respectively have a carbon-carbon unsaturated bond.
(5) The polymer for forming an insulating film according to any one of (1) to (4), wherein the polymerization of the polymer is a thermal polymerization causing the reactive compound to react under a catalyst-free condition.
(6) A composition for forming an insulating film including a polymer for forming an insulating film according to any one of (1) to (5).
(7) The composition for forming an insulating film according to (6), further including an adhesion promoter.
(8) An insulating film formed using the composition for forming an insulating film according to (6) or (7), wherein said insulating film has molecular spaces having an average space size of 0.8 nm to 5 nm and has a permittivity of 2.3 or less.
(9) An electronic device having an insulating film according to (8).

BRIEF DESCRIPTION OF THE DRAWINGS

FIG. 1 is a cross-sectional view schematically showing an example of a semiconductor device of the present invention.

BEST MODE FOR CARRYING OUT THE INVENTION

Below, the present invention will be explained in detail.
A polymer for forming an insulating film of the present invention is a polymer characterized by being obtained by polymerizing a reactive compound represented by Formula (1);

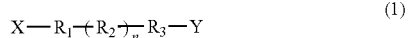

$R_1$, $R_2$, and $R_3$ in the above Formula (1) are the same or different from each other and respectively are an organic group having a ring structure; X and Y are the same or different from each other and respectively are an aromatic organic group having a reactive group; and n is 0 or 1.

In Formula (1), the organic group having a ring structure of $R_1$, $R_2$, and $R_3$ is not particularly limited, but aromatic groups and cyclic aliphatic groups may be mentioned. As such organic groups, aromatic groups such as a benzene ring, naphthalene ring, anthracene ring, pyrene ring, biphenyl ring, and fluorene ring; heterocyclic groups such as a furan ring, imidazole ring, pyran ring, pyrazine ring, pyrazole ring, pyridazine ring, pyridine ring, pyrimidine ring, pyrrole ring, selenophene ring, tellurophene ring, thiophene ring, and thiopyran ring; cycloalkyl groups such as a cyclobutane ring, cyclopentane ring, cyclohexane ring, cycloheptane ring, decalin ring, and norbornene ring; organic groups having a cage structure which have an adamantane structure as a minimum unit such as a polyamantane ring such as an adamantane ring, diamantane ring, triamantine ring, tetramantine ring, pentamantine ring, and hexamantine ring; cage siloxanes such as polyhedral oligomeric silsesquioxane; or fullerene and the like may be mentioned. Especially, organic groups having a cage structure such as an adamantane ring, diamantane ring, and triamantine ring are preferable. The reactive compound preferably has an organic group having a cage structure as at least one of $R_1$, $R_2$, and $R_3$ of Formula (1).

Especially, the reactive compound is preferably represented by Formula (2) or (3) below.

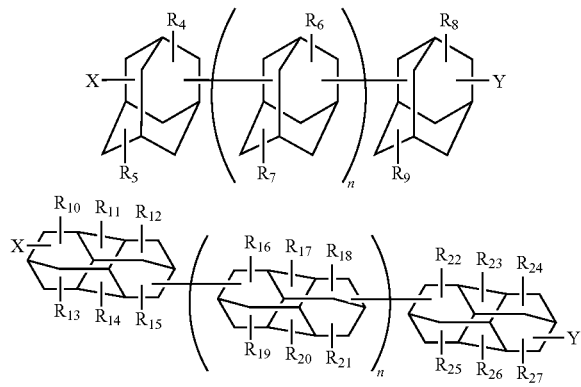

wherein, $R_4$ to $R_{27}$ respectively represent hydrogen or an organic group, X and Y are the same or different from each other and respectively represent an aromatic organic group having a reactive group, and n is 0 or 1.

In the organic groups having the ring structures described above, among the atoms forming the ring structures, the atoms other than the hydrogen atoms involved in connection by single bonds with neighboring organic groups having ring structures and aromatic organic groups having reactive groups may have bonded with them at least one of substituents or elements such as alkyl groups, aryl groups, and halogens.

Among these, $C_1$ to $C_{20}$ alkyl groups are preferable. As such alkyl groups, a methyl group, ethyl group, propyl group, butyl group, hexyl group, heptyl group, octyl group, and the like may be mentioned. Moreover, a methyl group and ethyl group are more preferable. By introducing these alkyl groups, it is possible to improve the solubility in organic solvents and the heat resistance.

Further, the organic group having the ring structure explained above is preferably a hydrocarbon group.

Further, in Formula (1), the aromatic group having a reactive group of X and Y is not limited so long as it is one having a polymerizable functional group as a reactive group. As the reactive group, a group having a polymerizable functional group having a carbon-carbon unsaturated bond such as a group having a carbon-carbon double bond and a group having a carbon-carbon triple bond; a maleimide group, nadimide group, biphenylene group, cyanato group, and cyclopentadienyl group may be mentioned. In view of the high reactivity and higher heat resistance, a group having a carbon-carbon unsaturated bond such as a group having a carbon-carbon double bond and group having a carbon-carbon triple bond is preferable. These reactive groups may have substituents such as phenyl groups. Further, the reactive group is particularly preferably a group having a carbon-carbon triple bond. An ethynyl group is particularly preferable. Further, as the aromatic organic group, a phenyl group, naphthyl group, and the like may be mentioned.

The number of the reactive groups in the aromatic organic group having a reactive group need only be one or more, but two or three is more preferable.

As specific examples of such an aromatic organic group having a reactive group, the organic groups represented by the following formulas may be mentioned:

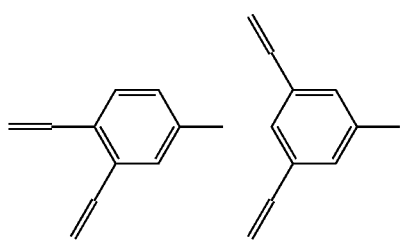
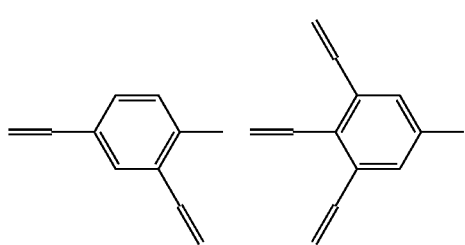
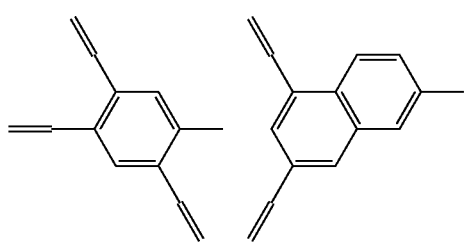
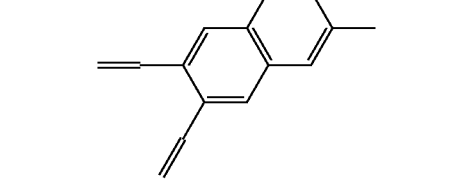
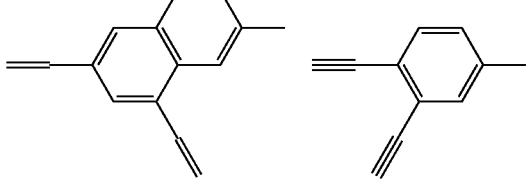
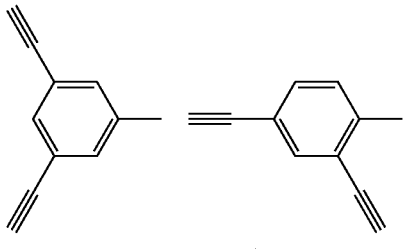
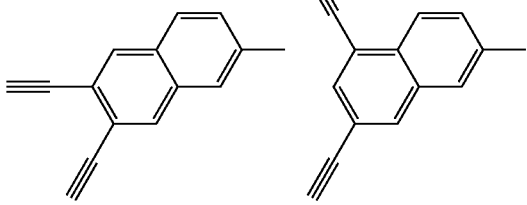
-continued
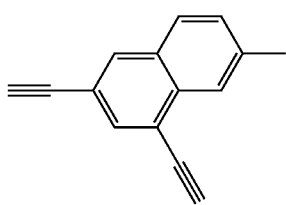
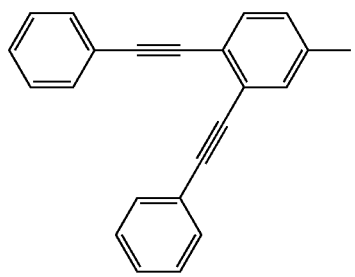
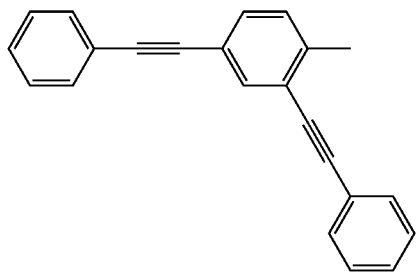
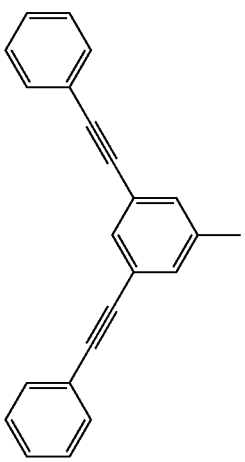
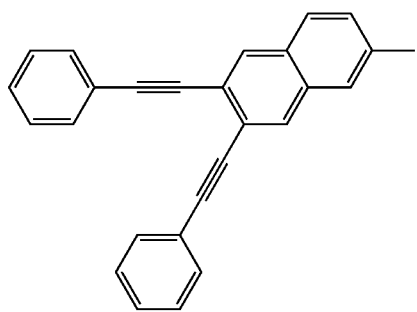

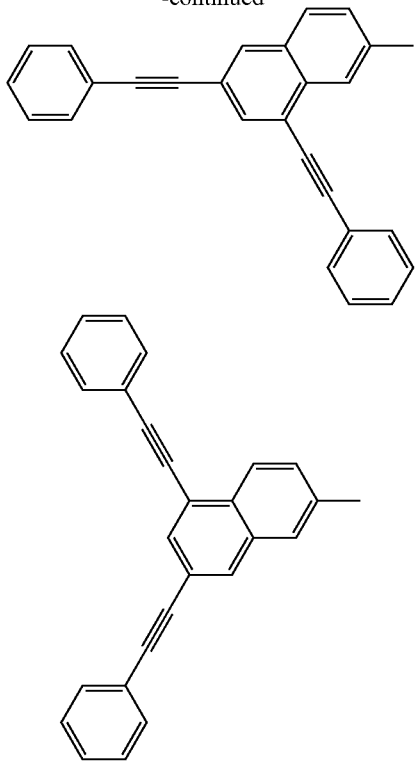

In the reactive compound represented by Formula (1), the polymerization reaction occurs due to the reactive groups of X and Y, but the X and Y and the $R_1$ to $R_3$ being linked to adjacent organic groups having a ring structure and aromatic organic groups having a reactive group by three (when n=0) or four (when n=1) single bonds (X—$R_1$, $R_1$-$R_2$, $R_2$-$R_3$, and $R_3$—Y) is an important point in the present invention. Because three or four single bonds are included, the degree of freedom of the conformation of the polymer is optimized and both the solubility of the polymer in a solvent and the stereoregularity for forming molecular spaces in the polymer and maintaining the molecular spaces are achieved. When there are two or less single bonds, the degree of freedom is too low, on the other hand, when there are five or more, the degree of freedom is too high, so a conformation cannot be obtained where the polymer can form molecular spaces. Such a conformation of a polymer may be obtained from reactive compounds represented by Formula (1) comprised of reactive compounds having different structures, however is more preferably a polymer obtained from a single composition. Better low permittivity characteristics are obtained. Also, due to the stereoregularity, an excellent insulating film having mechanical strength, especially strong toughness, can be obtained.

As the reactive compound represented by Formula (1), for example, when n=0, 3,3'-bis(3,4-divinylphenyl)-1,1'-biadamantane, 3,3'-bis(3,5-divinylphenyl)-1,1'-biadamantane, 3,3'-bis(2,4-divinylphenyl)-1,1'-biadamantane, 3,3'-bis(3,4,5-trivinylphenyl)-1,1'-biadamantane, 7,7'-bis(3,4-divinylphenyl)-3,3',5,5'-tetramethyl-1,1'-biadamantane, 7,7'-bis(3,5-divinylphenyl)-3,3',5,5'-tetramethyl-1,1'-biadamantane, 7,7'-bis(2,4-divinylphenyl)-3,3',5,5'-tetramethyl-1,1'-biadamantane, 7,7'-bis(3,4,5-trivinylphenyl)-3,3',5,5'-tetramethyl-1,1'-biadamantane, 3,3'-bis(3,4-bis(phenylethynyl)phenyl)-1,1'-biadamantane, 3,3'-bis(3,5-bis(phenylethynyl)phenyl)-1,1'-biadamantane, 3,3'-bis(2,4-bis(phenylethynyl) phenyl)-1,1'-biadamantane, 3,3'-bis(3,4,5-tris(phenylethynyl) phenyl)-1,1'-biadamantane, 7,7'-bis(3,4-bis(phenylethynyl) phenyl)-3,3',5,5'-tetramethyl-1,1'-biadamantane, 7,7'-bis(3,5-bis(phenylethynyl)phenyl)-3,3',5,5'-tetramethyl-1,1'-biadamantane, 7,7'-bis(2,4-bis(phenylethynyl)phenyl)-3,3',5,5'-tetramethyl-1,1'-biadamantane, 3,3'-bis(3,4-diethynylphenyl)-1,1'-biadamantane, 3,3'-bis(3,5-diethynylphenyl)-1,1'-biadamantane, 3,3'-bis(2,4-diethynylphenyl)-1,1'-biadamantane, 3,3'-bis(3,4,5-triethynylphenyl)-1,1'-biadamantane, 7,7'-bis(3,4-diethynylphenyl)-3,3',5,5'-tetramethyl-1,1'-biadamantane, 7,7'-bis(3,5-diethynylphenyl)-3,3',5,5'-tetramethyl-1,1'-biadamantane, 7,7'-bis(2,4-diethynylphenyl)-3,3',5,5'-tetramethyl-1,1'-biadamantane, 3,3'-bis(5,7-divinylnaphthyl)-1,1'-biadamantane, 3,3'-bis(6,7-divinylnaphthyl)-1,1'-biadamantane, 3,3'-bis(6,8-divinylnaphthyl)-1,1'-biadamantane, 7,7'-bis(5,7-divinylnaphthyl)-3,3',5,5'-tetramethyl-1,1'-biadamantane, 7,7'-bis(6,7-divinylnaphthyl)-3,3',5,5'-tetramethyl-1,1'-biadamantane, 7,7'-bis(6,8-divinylnaphthyl)-3,3',5,5'-tetramethyl-1,1'-biadamantane, 3,3'-bis(5,7-diethynylnaphthyl)-1,1'-biadamantane, 3,3'-bis(6,7-diethynylnaphthyl)-1,1'-biadamantane, 3,3'-bis(6,8-diethynylnaphthyl)-1,1'-biadamantane, 7,7'-bis(5,7-diethynylnaphthyl)-3,3',5,5'-tetramethyl-1,1'-biadamantane, 7,7'-bis(6,7-diethynylnaphthyl)-3,3',5,5'-tetramethyl-1,1'-biadamantane, 7,7'-bis(6,8-diethynylnaphthyl)-3,3',5,5'-tetramethyl-1,1'-biadamantane, 9,9'-bis(3,4-divinylphenyl)-4,4'-bidiamantane, 9,9'-bis(3,5-bivinylphenyl)-4,4'-bidiamantane, 9,9'-bis(2,4-bivinylphenyl)-4,4'-bidiamantane, 9,9'-bis(3,4,5-trivinylphenyl)-4,4'-bidiamantane, 9,9'-bis(3,4-bis(phenylethynyl)phenyl)-4,4'-bidiamantane, 9,9'-bis(3,5-bis(phenylethynyl)phenyl)-4,4'-bidiamantane, 9,9'-bis(2,4-bis(phenylethynyl)phenyl)-4,4'-bidiamantane, 9,9'-bis(3,4,5-tris(phenylethynyl)phenyl)-4,4'-bidiamantane, 9,9'-bis(5,7-divinylnaphthyl)-4,4'-bidiamantane, 9,9'-bis(6,7-divinylnaphthyl)-4,4'-bidiamantane, 9,9'-bis(6,8-divinylnaphthyl)-4,4'-bidiamantane, 9,9'-bis(5,7-bis(phenylethynyl)naphthyl)-4,4'-bidiamantane, 9,9'-bis(6,7-bis(phenylethynyl)naphthyl)-4,4'-bidiamantane, 9,9'-bis(6,8-bis(phenylethynyl)naphthyl)-4,4'-bidiamantane, 9,9'-bis(3,4-diethynylphenyl)-4,4'-bidiamantane, 9,9'-bis(3,5-diethynylphenyl)-4,4'-bidiamantane, 9,9'-bis(2,4-diethynylphenyl)-4,4'-bidiamantane, 9,9'-bis(3,4,5-triethynylphenyl)-4,4'-bidiamantane, 9,9'-bis(5,7-diethynylnaphthyl)-4,4'-bidiamantane, 9,9'-bis(6,7-diethynylnaphthyl)-4,4'-bidiamantane, 9,9'-bis(6,8-diethynylnaphthyl)-4,4'-bidiamantane; when n=1, 1,4-bis[3-(3,4-divinylphenyl)-1-adamantyl]benzene, 1,4-bis[3-(3,5-bivinylphenyl)-1-adamantyl]benzene, 1,4-bis[3-(2,4-divinylphenyl)-1-adamantyl]benzene, 1,4-bis[3-(3,4,5-trivinylphenyl)-1-adamantyl]benzene, 1,3-bis[3-(3,4-bivinylphenyl)-1-adamantyl]benzene, 1,3-bis[3-(3,5-divinylphenyl)-1-adamantyl]benzene, 1,3-bis[3-(2,4-divinylphenyl)-1-adamantyl]benzene, 1,3-bis[3-(3,4,5-trivinylphenyl)-1-adamantyl]benzene, 1,4-bis[3-(3,4-diethynylphenyl)-1-adamantyl]benzene, 1,4-bis[3-(3,5-diethynylphenyl)-1-adamantyl]benzene, 1,4-bis[3-(2,4-diethynylphenyl)-1-adamantyl]benzene, 1,4-bis[3-(3,4,5-triethynylphenyl)-1-adamantyl]benzene, 1,3-bis[3-(3,4-diethynylphenyl)-1-adamantyl]benzene, 1,3-bis[3-(3,5-diethynylphenyl)-1-adamantyl]benzene, 1,3-bis[3-(2,4-diethynylphenyl)-1-adamantyl]benzene, 1,3-bis[3-(3,4,5-triethynylphenyl)-1-adamantyl]benzene, 1,4-bis[3-(3,4-bis(phenylethynyl)phenyl)-1-adamantyl]benzene, 1,4-bis[3-(3,5-bis(phenylethynyl)phenyl)-1-adamantyl]benzene, 1,4-bis[3-(2,4-bis(phenylethynyl)phenyl)-1-adamantyl]benzene, 1,4-bis[3-(3,4,5-tris(phenylethynyl)phenyl)-1-adamantyl]

benzene, 1,3-bis[3-(3,4-bis(phenylethynyl)phenyl)-1-adamantyl]benzene, 1,3-bis[3-(3,5-bis(phenylethynyl)phenyl)-1-adamantyl]benzene, 1,3-bis[3-(2,4-bis(phenylethynyl)phenyl)-1-adamantyl]benzene, 1,3-bis[3-(3,4,5-tris(phenylethynyl)phenyl)-1-adamantyl]benzene, 1,4-bis[3-(3,4-divinylphenyl)-5,7-dimethyl-1-adamantyl]benzene, 1,4-bis[3-(3,5-divinylphenyl)-5,7-dimethyl-1-adamantyl]benzene, 1,4-bis[3-(2,4-divinylphenyl)-5,7-dimethyl-1-adamantyl]benzene, 1,4-bis[3-(3,4,5-trivinylphenyl)-5,7-dimethyl-1-adamantyl]benzene, 1,3-bis[3-(3,4-divinylphenyl)-5,7-dimethyl-1-adamantyl]benzene, 1,3-bis[3-(3,5-divinylphenyl)-5,7-dimethyl-1-adamantyl]benzene, 1,3-bis[3-(2,4-divinylphenyl)-5,7-dimethyl-1-adamantyl]benzene, 1,3-bis[3-(3,4,5-trivinylphenyl)-5,7-dimethyl-1-adamantyl]benzene, 1,4-bis[3-(3,4-bis(phenylethynyl)phenyl)-5,7-dimethyl-1-adamantyl]benzene, 1,4-bis[3-(3,5-bis(phenylethynyl)phenyl)-5,7-dimethyl-1-adamantyl]benzene, 1,4-bis[3-(2,4-bis(phenylethynyl)phenyl)-5,7-dimethyl-1-adamantyl]benzene, 1,4-bis[3-(3,4,5-tris(phenylethynyl)phenyl)-5,7-dimethyl-1-adamantyl]benzene, 1,3-bis[3-(3,4-bis(phenylethynyl)phenyl)-5,7-dimethyl-1-adamantyl]benzene, 1,3-bis[3-(3,5-bis(phenylethynyl)phenyl)-5,7-dimethyl-1-adamantyl]benzene, 1,3-bis[3-(2,4-bis(phenylethynyl)phenyl)-5,7-dimethyl-1-adamantyl]benzene, 1,3-bis[3-(3,4,5-tris(phenylethynyl)phenyl)-5,7-dimethyl-1-adamantyl]benzene, 1,4-bis[3-(3,4-diethynylphenyl)-5,7-dimethyl-1-adamantyl]benzene, 1,4-bis[3-(3,5-diethynylphenyl)-5,7-dimethyl-1-adamantyl]benzene, 1,4-bis[3-(2,4-diethynylphenyl)-5,7-dimethyl-1-adamantyl]benzene, 1,4-bis[3-(3,4,5-triethynylphenyl)-5,7-dimethyl-1-adamantyl]benzene, 1,3-bis[3-(3,4-diethynylphenyl)-5,7-dimethyl-1-adamantyl]benzene, 1,3-bis[3-(3,5-diethynylphenyl)-5,7-dimethyl-1-adamantyl]benzene, 1,3-bis[3-(2,4-diethynylphenyl)-5,7-dimethyl-1-adamantyl]benzene, 1,3-bis[3-(3,4,5-triethynylphenyl)-5,7-dimethyl-1-adamantyl]benzene, 1,4-bis[9-(3,4-divinylphenyl)-4-diamantyl]benzene, 1,4-bis[9-(3,5-divinylphenyl)-4-diamantyl]benzene, 1,4-bis[9-(2,4-divinylphenyl)-4-diamantyl]benzene, 1,4-bis[9-(3,4,5-trivinylphenyl)-4-diamantyl]benzene, 1,3-bis[9-(3,4-divinylphenyl)-4-diamantyl]benzene, 1,3-bis[9-(3,5-divinylphenyl)-4-diamantyl]benzene, 1,3-bis[9-(2,4-divinylphenyl)-4-diamantyl]benzene, 1,3-bis[9-(3,4,5-trivinylphenyl)-4-diamantyl]benzene, 1,4-bis[9-(3,4-bis(phenylethynyl)phenyl)-4-diamantyl]benzene, 1,4-bis[9-(3,5-bis(phenylethynyl)phenyl)-4-diamantyl]benzene, 1,4-bis[9-(2,4-bis(phenylethynyl)phenyl)-4-diamantyl]benzene, 1,4-bis[9-(3,4,5-tris(phenylethynyl)phenyl)-4-diamantyl]benzene, 1,3-bis[9-(3,4-bis(phenylethynyl)phenyl)-4-diamantyl]benzene, 1,3-bis[9-(3,5-bis(phenylethynyl)phenyl)-4-diamantyl]benzene, 1,3-bis[9-(2,4-bis(phenylethynyl)phenyl)-4-diamantyl]benzene, 1,3-bis[9-(3,4,5-bis(phenylethynyl)phenyl)-4-diamantyl]benzene, 1,4-bis[9-(3,4-diethynylphenyl)-4-diamantyl]benzene, 1,4-bis[9-(3,5-diethynylphenyl)-4-diamantyl]benzene, 1,4-bis[9-(2,4-diethynylphenyl)-4-diamantyl]benzene, 1,4-bis[9-(3,4,5-triethynylphenyl)-4-diamantyl]benzene, 1,3-bis[9-(3,4-diethynylphenyl)-4-diamantyl]benzene, 1,3-bis[9-(3,5-diethynylphenyl)-4-diamantyl]benzene, 1,3-bis[9-(2,4-diethynylphenyl)-4-diamantyl]benzene, 1,3-bis[9-(3,4,5-triethynylphenyl)-4-diamantyl]benzene, 3,3"-bis(3,4-divinylphenyl)-1,1':3',1"-triadamantane, 3,3"-bis(3,5-divinylphenyl)-1,1':3',1"-triadamantane, 3,3"-bis(2,4-divinylphenyl)-1,1':3',1"-triadamantane, 3,3"-bis(3,4,5-trivinylphenyl)-1,1':3',1"-triadamantane, 3,3"-bis(3,4-diethynylphenyl)-1,1':3',1"-triadamantane, 3,3"-bis(3,5-diethynylphenyl)-1,1':3',1"-triadamantane, 3,3"-bis(2,4-diethynylphenyl)-1,1':3',1"-triadamantane, 5,7,5',7',5",7"-hexamethyl-3,3"-bis(3,4-divinylphenyl)-1,1':3',1"-triadamantane, 3,3"-bis(3,5-divinylphenyl)-5,7,5',7',5",7"-hexamethyl-1,1':3',1"-triadamantane, 3,3"-bis(2,4-divinylphenyl)-5,7,5',7',5",7"-hexamethyl-1,1':3',1"-triadamantane, 3,3"-bis(3,4,5-trivinylphenyl)-5,7,5',7',5",7"-hexamethyl-1,1':3',1"-triadamantane, 3,3"-bis(3,4-bis(phenylethynyl)phenyl)-5,7,5',7',5",7"-hexamethyl-1,1':3',1"-triadamantane, 3,3"-bis(3,5-bis(phenylethynyl)phenyl)-5,7,5',7',5",7"-hexamethyl-1,1':3',1"-triadamantane, 3,3"-bis(2,4-bis(phenylethynyl)phenyl)-5,7,5',7',5",7"-hexamethyl-1,1':3',1"-triadamantane, 3,3"-bis(3,4-diethynylphenyl)-5,7,5',7',5",7"-hexamethyl-1,1':3',1"-triadamantane, 3,3"-bis(3,5-diethynylphenyl)-5,7,5',7',5",7"-hexamethyl-1,1':3',1"-triadamantane, and 3,3"-bis(2,4-diethynylphenyl)-5,7,5',7',5",7"-hexamethyl-1,1':3',1"-triadamantane may be mentioned. The compounds mentioned above are just representative examples. Compounds of these representative examples where the organic groups having ring structures and the aromatic organic groups having reactive groups are substituted in the above way are also included in the scope of the present invention, but, needless to say, the present invention is not limited to these.

The polymerization reaction of the reactive compound represented by Formula (1) is not particularly limited. A known polymerization method may be applied.

As the above polymerization method, for example, a method by radical polymerization using a radical initiator such as benzoyl peroxide, t-butyl peroxide, azobisisobutyronitrile etc.; a method by photoradical polymerization using light irradiation etc.; a method by polymerization using a palladium catalyst such as dichlorobis(triphenylphosphine) palladium (II), bis(benzonitrile)palladium (II) dichloride, tetrakis(triphenylphosphine) palladium (0), etc.; a method by thermal polymerization comprising heating and reacting without using a catalyst; a method by polymerization using a transition metal catalyst such as copper (II) acetate; a method by polymerization using a transition metal chloride such as molybdenum (V) chloride, tungsten (VI) chloride, tantalum (V) chloride, etc., may be mentioned. Among these, because the reaction is easily controlled to give the desired polymer and the removal of impurities due to the remaining catalyst and the like is unnecessary, the method by thermal polymerization is preferable.

The reaction conditions should be suitably changed according to the structure of the reactive compound represented by Formula (1). In particular, when the reactive group is a carbon-carbon unsaturated bond, the reaction temperature is usually 0° C. to 500° C. or so. When performing thermal polymerization, the reactive compound represented by Formula (1) is desirably dissolved in an organic solvent. The concentration of the reactive compound represented by Formula (1) in the organic solvent is generally 1 mass % to 50 mass % or so. A reaction temperature and a concentration of the reactive compound represented by Formula (1) at the time of the reaction outside of the above ranges may also be used, but if they are too high, the molecular weight becomes larger and that the polymer is liable to become insoluble in an organic solvent.

The organic solvent in the polymerization reaction is not particularly limited, but for example an alcohol solvent such as methanol, ethanol, isopropanol, 1-butanol, and 2-butanol; a ketone solvent such as acetylacetone, methyl ethyl ketone, methyl isobutyl ketone, cyclopentanone, cyclohexanone, cycloheptanone, 2-pentanone, and 2-heptanone; an ester solvent such as ethyl acetate, propyl acetate, butyl acetate, pentyl acetate, isoamyl acetate, γ-butyrolactone, and propylene glycol monomethylether acetate; an ether solvent such as diisopropyl ether, dibutyl ether, tetrahydrofuran, anisole, ethoxy benzene, 1,2-dimethoxybenzene, 1,3-dimethoxybenzene, 1,4-dimethoxybenzene, and diphenyl ether; an aromatic hydrocarbon solvent such as benzene, toluene, xylene, mesitylene, ethylbenzene, diethylbenzene and propylbenzene; an amide solvent such as N-methylpyrrolidone, N,N-dimethylacetamide, and N,N-dimethylformamide; and in addition dimethyl sulfoxide, propylene carbonate, diethyl carbonate, etc. are suitable as solvents. These may be used alone or in mixtures of two or more types.

These polymerization reactions usually proceed by part or all of the reactive compound represented by Formula (1) reacting.

In the reactive compound represented by Formula (1), when the reactive group is a carbon-carbon unsaturated bond, the thus obtained polymer is preferably a prepolymer having an unsaturated bond produced by reaction of unsaturated bonds with each other or an unsaturated bond produced by reaction of unsaturated bond with each other and an unreacted unsaturated bond. By forming such a prepolymer, the heat resistance and mechanical properties (especially the elasticity) can be improved. As specific examples, if explaining the polymer by a simplified chemical formula where, when the group including the unsaturated bond group is an ethynyl group, in the Formula (1), the parts other than when making the terminal reactive groups ethynyl groups are defined as "Z", compounds represented by Formula (1) which can be given structures having repeating units of the structures shown below may be mentioned, but the invention is not limited to these.

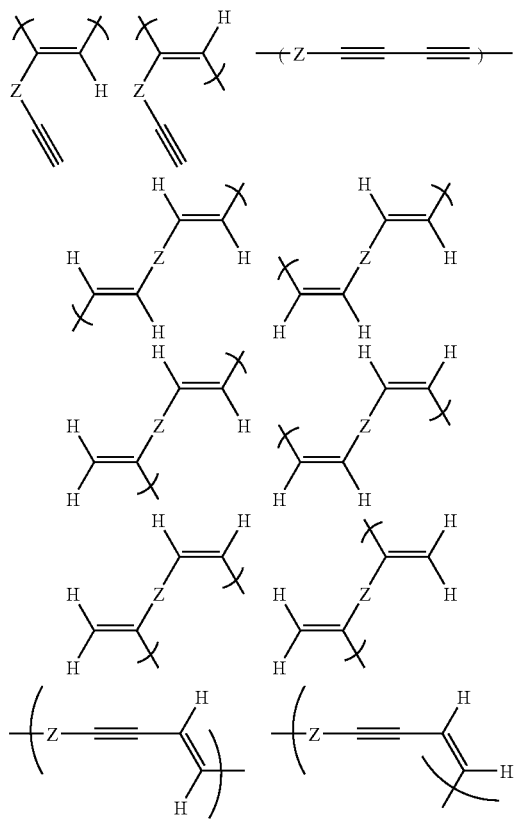

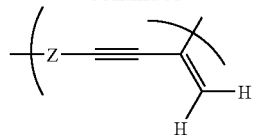

Thus obtained polymer may be an oligomer or polymer, but the weight average molecular weight converted to polystyrene measured by a gel permeation chromatograph (GPC) is preferably 10,000 to 500,000, more preferably 20,000 to 300,000, in terms of film formation.

The composition for forming an insulating film of the present invention includes the polymer for forming an insulating film obtained above. Generally, as discussed later, this is coated as a varnish on a support to form a film, so includes a solvent for dissolving or dispersing the polymer. When making it a varnish, it is possible to collect the polymer obtained from the above reaction, dry it to a solid, and dissolve this in an organic solvent to make the varnish composition for forming the insulating film, to directly use a reaction solution obtained from the manufacture of the polymer as a varnish, or to mix the reaction solution with another organic solvent.

The organic solvent used for the composition for forming an insulating film is not particularly limited so long as one which can dissolve or disperse the polymer, but ones similar to the organic solvents used for the above polymerization reaction can be mentioned. The concentration of the composition for forming an insulating film in the varnish may be suitably decided according to the structure and molecular weight of the polymer, but in the varnish of the composition for forming an insulating film, the polymer is preferably included in 0.1 mass % to 50 mass %, more preferably 0.5 mass % to 15 mass %.

Further, the composition for forming an insulating film may include, as needed, various kind of additives such as a surfactant, a coupling agent such as a silane coupling agent, or other adhesion promoters; a radical initiator giving off oxygen radicals or sulfur radicals upon heating; a catalyst such as a disulfide, etc. Further, the composition for forming an insulating film may have added to it a naphthoquinone diazide compound etc. as a photosensitizing agent so as to enable use as a surface protection film having photosensitivity. Further, the composition for forming an insulating film may have added to it a pore-forming agent. In that case, however, the molecular spaces formed by the polymer itself and the pores formed by the pore-forming agent will end up co-existing, so it is desirable to limit combined use to a range not detracting from the characteristics of the structure having the molecular spaces formed by the polymer itself—the object of the invention.

Among the ingredients of the composition for forming an insulating film of the present invention discussed above, an adhesion promoter is preferably added. By adding the adhesion promoter, the adhesion of the insulating film to the substrate discussed below is improved. Further, when forming a semiconductor device as discussed below, the adhesion of the insulating film to the various films formed above it is improved and the reliability of the semiconductor device becomes higher.

As the adhesion promoter, a silane compound or a hydrolysate or condensate of the same or mixtures thereof; a metal chelate compound such as an aluminum chelate compound, titanium chelate compound, or zirconium chelate compound; a polybenzazole compound such as polybenzoxazole, polybenzimidazole, and polybenzothiazole, etc., may be mentioned. As specific examples, an aminosilane compound such as N-methylaminoethyl trimethoxysilane, N,N-dimethylaminoethyl trimethoxysilane, N-ethylaminoethyl trimethoxysilane, N,N-diethylaminoethyl trimethoxysilane, N-phenylaminoethyl trimethoxysilane, N,N-diphenylaminoethyl trimethoxysilane, N-toluoylaminoethyl trimethoxysilane, N-(dimethylphenyl)aminoethyl trimethoxysilane, N-methylaminoethyl triethoxysilane, N,N-dimethylaminoethyl triethoxysilane, N-ethylaminoethyl triethoxysilane, N,N-diethylaminoethyl triethoxysilane, N-phenylaminoethyl triethoxysilane, N,N-diphenylaminoethyl triethoxysilane, N-toluoylaminoethyl triethoxysilane, N-(dimethylphenyl)aminoethyl triethoxysilane, N-methylaminopropyl trimethoxysilane, N,N-dimethylaminopropyl trimethoxysilane, N-2-(aminoethyl)-3-aminopropyl trimethoxysilane, N-2-(aminoethyl)-3-aminopropyl methyldimethoxysilane, N-methylaminoethyl methyldiethoxysilane, N-2-(aminoethyl)-3-aminopropyl trimethoxysilane, N,N-dimethylaminoethyl methyldiethoxysilane, N-2-(aminoethyl)-3-aminopropyl triethoxysilane, 3-ethoxysilyl-N-(1,3-dimethylbutylidene)propylamine, N-methylaminoethyl tripropoxysilane, N-methylaminoethyl tributoxysilane, N-methylaminoethyl trihexoxysilane, N,N-dimethylaminoethyl tripropoxysilane, N,N-dimethylaminoethyl tributoxysilane, N,N-dimethylaminoethyl trihexoxysilane, and 3-aminopropyl trimethoxysilane, 3-aminopropyl triethoxysilane; tetraalkoxysilane compound such as tetraethoxysilane and tetramethoxysilane; vinylsilane compound such as vinyltrimethoxysilane, vinyltriethoxysilane and p-styryl trimethoxysilane; an epoxysilane compound such as 2-(3,4-epoxycyclohexyl)ethyl trimethoxysilane, 3-glycidoxypropyl trimethoxysilane and 3-glycidoxypropyl methyldiethoxysilane; a methacrylsilane compound such as 3-methacryloxypropyl trimethoxysilane; ureidosilane compound such as 3-ureidopropyl triethoxysilane; a mercaptosilane compound such as 3-mercaptopropyl methyldimethoxysilane and 3-mercaptopropyl trimethoxysilane; an isocyanatesilane compound such as 3-isocyanatepropyl triethoxysilane; an imidazolylsilane compound such as N-(3-triethoxysilylpropyl-4,5-dihydroimidazole; a metal chelate compound such as aluminum butoxyethyl actoacetate, etc. may be mentioned. Needless to say, the above compounds are representative examples and the present invention is not limited to them in any way. Further, it is possible to use a plurality of these in combination. Among these, aminosilane compounds, vinylsilane compounds, imidazolylsilane compounds, and mixtures thereof are preferable. In particular, aminosilane compounds and mixtures of aminosilane compounds are especially preferable. The amount of addition of the adhesion promoter to the composition for forming an insulating film is 0.01 mass % to 10 mass %, preferably 0.05 mass % to 5 mass %, more preferably 0.1 mass % to 3 mass %, with respect the polymer in the composition for forming an insulating film.

As the method of use of the adhesion promoter, in addition to the method of adding it to the composition for forming an insulating film of the present invention as discussed above, it is also possible to use the method of treating a substrate, to be formed with an insulating film using the composition for forming an insulating film, in advance with the adhesion promoter. At that time, the composition for forming an insulating film may also include an adhesion promoter or need not include it.

Next, the insulating film will be explained.

The insulating film of the present invention is obtained using the above composition for forming an insulating film. For example, it may be produced by coating a varnish of a composition for forming an insulating film obtained above on a support such as a substrate, then treating this by heat or active energy rays. Further, it may be produced by coating the reaction solution obtained above on the support as it is or after heating the composition for forming an insulating film to dissolve it. Treating the varnish by heat, active energy rays, etc., cross-links the unsaturated bonds remaining in the polymer and thereby enables provision of a resin film better in heat resistance and elastic modulus.

Further, regarding the method of production of an insulating film of the present invention, if explaining a specific example of the case of use of a varnish of the composition for forming an insulating film, first, a varnish of the composition for forming an insulating film is coated on a suitable support, for example, an organic substrate such as a polyester film, a metal sheet such as a copper foil, a semiconductor substrate such as a silicon wafer or ceramic substrate, and so on to form a coated film. As the coating method, spin coating using a spinner, spray coating using a spray coater, dipping, printing, roll coating, and other methods may be mentioned. After this, the coated film is dried and treated by heat etc., to remove the solvent, then cured by a method using heat, a method using active energy rays, a method using these two methods, etc., to enable formation of a resin film having superior mechanical properties. The "curing" referred to here is the general term for the phenomena where, in a polymer characterized by being obtained by polymerization of a reactive compound represented by Formula (1), reactive groups remaining unreacted after the polymerization reaction react to form cross-linked structures or polymers aggregate resulting in increased interaction.

In the method using heat, for example, a heated plate such as a hot plate, furnace oven, oven, reduced pressure oven, etc., can be used to heat the film at 150 to 450° C. for 1 minute to 24 hours or so, preferably at 200 to 425° C. for 3 minutes to 5 hours, more preferably at 250 to 400° C. for 3 minutes to 2 hours. As to the active energy rays, visible light, ultraviolet light, infrared light, laser light, and other active energy light rays, X-rays, electron beams, microwaves, etc., may be mentioned. When emitting these active energy rays, the film may be simultaneously heated or may be irradiated separated from heating. When heating and emitting active energy rays, while not particularly limited to this, in order to inhibit the oxidation of the insulating film, the concentration of the oxidizing gases such as oxygen in the atmosphere is preferably made 1 vol % or less, more preferably 100 ppm or less.

The insulating film of the present invention may be formed by directly coating the varnish on a substrate such as a semiconductor substrate by the above method or may be used as a dry film by forming a resin film on a support such as an organic support and then peeling it off from the support.

Further, in order to enhance the adhesion with the support such as the substrate, it is possible to form a layer of an adhesion promoter on the substrate, then form the resin film on top of that.

The insulating film, as described above, is formed from the composition for forming an insulating film including a polymer characterized by being obtained by polymerization of a reactive compound represented by Formula (1) and has molecular spaces formed by the polymer. The insulating film of the present invention has molecular spaces of an average space size of 0.8 to 5 nm even without using a pore forming agent. Due to this, a 2.3 or less permittivity is obtained and, furthermore, a uniform film is obtained.

In the present invention, as the method for measuring the molecular spaces in the polymer in the insulating film, for example, the method by small-angle X-ray scattering (SAXS), the method by gas adsorption, the method by positron lifetime spectroscopy, the adsorption spectroscopic ellipsometry ready measurement (in situ Spectroscopic Ellipsometry), etc., may be mentioned. In the present invention, the method of measuring the spaces is not particularly limited. Among these, the method by positron lifetime spectroscopy is a method enabling precise measurement of spaces of a sub nanometer to nanometer order. For measurement of the spaces in the present invention, therefore, the positron lifetime spectroscopy method was used. The positron lifetime spectroscopy method fires a positron beam at the insulating film and measures the lifetime until the positrons disappear to thereby enable measurement of the size of spaces as the average space size. In positron lifetime spectroscopy, the positron lifetime spectra are similar both when forming an $SiO_2$ film and so on over the top of the insulating film as cap film and when not, so the formed molecular spaces have extremely low continuity and are independent.

The positron lifetime can be measured by shooting positrons into a sample comprised of a silicon wafer or other substrate on which an insulating film is formed to a thickness of 100 nm to 1000 nm and detecting the γ-rays formed when the positrons disappear. Further, the permittivity can be measured by the mercury probe method or the method of forming aluminum electrodes having different areas on the insulating film by vapor deposition and finding the value from the slant of the capacitance.

As applications of the insulating film, for example, an interlayer insulating film or a surface protection film for a semiconductor, an interlayer insulating film for a multilayer circuit, a cover coat for a flexible copper clad laminate, a solder resist film, a liquid crystal alignment layer, an etching protection film (etching stopper), an adhesive agent, etc., may be mentioned. Among these in particular, it is preferably used for an interlayer insulating film and surface protective film for a semiconductor and as an etching protection film.

The glass transition temperature of the insulating film obtained above is not particularly limited, but is preferably 350° C. or more, more preferably 400° C. or more, most preferably 420 to 500° C. If the glass transition temperature is within the above range, the linear expansion coefficient of the insulating film can be decreased and an insulating film which is excellent in dimensional stability can be obtained.

The thickness of the insulating film is not particularly limited, but in an interlayer insulating film for a semiconductor, etc., is preferably 0.01 to 20 μm, particularly preferably 0.02 to 10 μm, most preferably 0.05 to 0.5 μm. If the thickness is within the above range, the insulating film is excellent in compatibility with the manufacturing process of the semiconductor.

In a protective film for a semiconductor, etc., the thickness is preferably 0.05 to 70 μM, particularly preferably 0.1 to 50 μm. If the thickness is within the above range, the insulating film is particularly excellent in both of the protective property of the semiconductor device and workability.

When using the insulating film as an interlayer insulating film for a semiconductor, for example, a varnish of the composition for forming an insulating film is directly coated on the predetermined positions of the silicon wafer or ceramic substrate to form a coated film. As the coating method, spin coating using a spinner, spray coating using spray coater, dipping, printing, roll coating, or another method may be mentioned. After this, the coated film is dried, the solvent is removed, and, in the same way as above, the film is cured by a method using heat, a method using active energy rays, or a method using both methods to enable formation of an interlayer insulating film. In addition, it is also possible to use the composition for forming an insulating film to form a dry film in advance and laminate this at predetermined positions.

Further, when using the insulating film as a protective film for a semiconductor as well, in the same way as the interlayer insulating film for a semiconductor, a varnish of the composition for forming an insulating film is directly coated at predetermined positions of the silicon wafer, ceramic substrate, etc. As the coating method, spin coating using a spinner, spray coating using a spray coater, dipping, printing, roll coating, and so on may be mentioned. After this, the coated film is dried, the solvent is removed, and, in the same way as above, the film is cured by a method using heat, a method using active energy rays, or a method using both methods to enable formation of a protective film comprised of the resin film.

Next, an electronic device of the invention will be explained using preferred embodiments. However, the present invention is not limited to the embodiments.

FIG. 1 is a cross-sectional view schematically showing an example of an electronic device of the present invention.

The electronic device 100 is comprised of a semiconductor substrate 1 on which elements are formed and an interconnect structure provided on the top side of the semiconductor substrate 1 (top side of FIG. 1). A substrate 1 in which transistors and other elements are built is first formed with a first interlayer insulating film 2. For the insulating film, an organic insulating film formed from the insulating film forming composition of the present invention, an inorganic insulating film formed by the chemical vapor deposition (CVD) method, etc. is used. The insulating film has an interconnect layer built into it for establishing electrical connection with the elements and has a structure of the interlayer insulating film 2 and a copper interconnect layer 3 covered by a barrier metal layer 4.

The interlayer insulating film 2 is formed with recesses corresponding to the patterns to be laid. The copper interconnect layer 3 is formed in these recesses.

Further, between the interlayer insulating film 2 and the copper interconnect layer 3, for example, in order to improve the adhesion of the interlayer insulating film 2 and the barrier metal layer 4 or, when there is no barrier metal layer 4, in order to improve the adhesion of the interlayer insulating film 2 and the copper interconnect layer 3, the inner surface of the later explained interconnect grooves is sometimes provided with a layer treated by plasma etc.

Further, at the top side of the interlayer insulating film 2 (side opposite to the semiconductor substrate 1), a hard mask layer 5 is formed. Above this first layer of interconnects, a further interconnect layer is formed. In the same way as above, an interlayer insulating film and the like are formed to enable formation of a multilayer interconnect structure.

As the method for fabrication of the electronic device 100, first, a semiconductor substrate 1 comprised of a silicon wafer in which transistors and other elements are formed is prepared. On top of this, an interlayer insulating film 2 and a hard mask layer 5 are formed. Further, a photoresist layer is formed on top of this. Dry etching is used to form interconnect grooves running through predetermined positions of the insulating layer comprised of the interlayer insulating film and the hard mask layer. Next, the inner surface of the interconnect grooves is formed with a barrier metal layer 4 comprised of Ta, Ti, TaN, TiN, WN, etc., by the PVD method, CVD method, or other method. Further, electroplating, etc., is used to form a copper layer 3 forming an interconnect layer.

After this, the CMP method is used to polish off the copper layer and the barrier metal layer at parts other than the interconnect parts and to planarize the surface to thereby finish the electronic device 100.

Further, when stacking interconnect layers as well, basically they may be formed in the same way as the formation of the first interconnect layer.

As a more specific method for forming the interlayer insulating film 2, while the semiconductor substrate 1 may be directly coated by a varnish of the composition for forming an insulating film to form the film, it is also possible to prepare a dry film of the resin film in advance and laminate it on the semiconductor substrate 1. More specifically, the semiconductor substrate 1 may be formed with a coated film by directly coating the varnish of the composition for forming an insulating film obtained above and then heating and/or irradiating the film with active energy rays to cure it. When using a dry film, a varnish of the composition for forming an insulating film obtained above is used to form a resin layer on a substrate and is then dried to form a dry film. This can then be laid on the semiconductor substrate 1 and heated and/or irradiated with active energy rays to cure it. Note that the positions for forming the interlayer insulating film are not limited to this.

Further, in this embodiment, an electronic device 100 using the interlayer insulating film 2 was explained, however, the present invention is not limited to this.

Since the electronic device of the present invention uses the interlayer insulating film discussed above, it is superior in dimensional accuracy and can sufficiently exhibit an insulation property so the reliability of connection is excellent.

Further, the insulating film discussed above is excellent in dielectric property, so that the interconnect delay can be reduced.

EXAMPLES

Below, the present invention will be explained in detail by examples and comparative examples, but the present invention is not limited to these.

Synthesis Example 1

Synthesis of 7,7'-bis(3,5-bis(phenylethynyl)phenyl)-3,3',5,5'-tetramethyl-1,1'-biadamantane 1) Synthesis of 3,3',5,5'-tetramethyl-1,1'-biadamantane A four-neck 1000 ml flask provided with a thermometer, stirrer, and reflux tube was charged with metal sodium 14 g (0.6 mol) and n-octane 600 ml and was cooled to an inside temperature of 0° C. While vigorously stirring, 1-bromo-3,5-dimethyl adamantane 73.0 g (0.3 mol) previously dissolved in n-octane 300 ml was gradually added dropwise. While dropping, the inside temperature was kept at 0° C. to 5° C. After the end of the dropwise addition, when the temperature no longer rose, the reaction was continued for 1 hour. After that, the reactant was poured into cold water 1500 ml, then the crude product was separated by filtration, rinsed with pure water, and dried. Further, the crude product was recrystallized by hot hexane. The obtained recrystallized product was dried under reduced pressure to obtain the product 78.2 g.

By IR analysis, absorption of the Br group (around 690 to 515 $cm^{-1}$) disappears. By mass analysis, the molecular weight is 326. From these results, the product was shown to be 3,3',5,5'-tetramethyl-1,1'-biadamantane.

2) Synthesis of 7,7'-dibromo-3,3',5,5'-tetramethyl-1,1'-biadamantane

A four-neck 2000 ml flask provided with a thermometer, stirrer, and reflux tube was charged with carbon tetrachloride 700 ml and bromine 35 g (0.22 mol). While stirring, the above obtained 3,3',5,5'-tetramethyl-1,1'-biadamantane 65.2 g (0.2 mol) was added little by little. While adding, the inside temperature was kept at 20° C. to 30° C. After the end of addition, when the temperature no longer rose, the reaction was continued for 1 hour. After that, the reactant was poured into cold water 2000 ml, then the crude product was separated by filtration, rinsed with pure water, and dried. The crude product was recrystallized by hot ethanol. The obtained recrystallized product was dried under reduced pressure to obtain the product 65.0 g.

By IR analysis, absorption of the bromo group is found at 690 to 515 $cm^{-1}$. By mass analysis, the molecular weight is 482. From these results, the product was shown to be 7,7'-dibromo-3,3',5,5'-tetramethyl-1,1'-biadamantane.

3) Synthesis of 7,7'-bis(3,5-dibromophenyl)-3,3',5,5'-tetramethyl-1,1'-biadamantane A 3-liter recovery flask was charged with the above synthesized 7,7'-dibromo-3,3',5,5'-tetramethyl-1,1'-biadamantane 48.4 g (100 mmol), 1,3-dibromo benzene 1180 g (500 mmol), and a stirrer. While stirring under a nitrogen flow at room temperature, aluminum bromide (III) 26.7 g (100 mmol) was added little by little. After the end of addition, the solution was stirred at 50° C. for 7 hours. The reaction solution was charged into a 1 mol/liter hydrochloric acid solution 2 liter, the aqueous phase was removed by separation, then acetone 1 liter was added for extraction. The solid was collected by filtration and dried under reduced pressure to obtain 7,7'-bis(3,5-dibromophenyl)-3,3',5,5'-tetramethyl-1,1'-biadamantane (90.0 mmol; yield 90.0%) 71.5 g.

4) Synthesis of 7,7'-bis(3,5-bis(phenylethynyl)phenyl)-3,3',5,5'-tetramethyl-1,1'-biadamantane Next, a 3-liter recovery flask was charged with the above-obtained 7,7'-bis(3,5-dibromophenyl)-3,3',5,5'-tetramethyl-1,1'-biadamantane 39.7 g (50.0 mmol), ethynylbenzene 40.9 g (400 mmol), dichlorobistriphenyl-phosphine palladium 3.5 g (5.0 mmol), copper (I) iodide 3.8 g (20.0 mmol), triphenylphosphine 5.2 g (20.0 mmol), triethylamine 1 liter, and a stirrer. These were stirred under a nitrogen flow at 95° C. for 6 hours. The reaction solution was charged into acetone 1 liter, the precipitated solid was rinsed with a 2 mol/liter hydrochloric acid solution 1 liter and acetone 1 liter, then was dried under reduced pressure to obtain the product 26.4 g.

Below, the appearance of the product obtained above and the results of the mass analysis and elemental analysis are shown. This data shows that the obtained compound is 7,7'-bis(3,5-bis(phenylethynyl)phenyl)-3,3',5,5'-tetramethyl-1,1'-biadamantane.

Appearance: white solid
MS (FD) (m/z); 878 ($M^+$)
Elemental Analysis
Theoretical value (%): C, 92.89, H, 7.11
Measured value (%): C, 92.95, H, 7.05

Synthesis Example 2

7,7'-bis(3,5-bis(phenylethynyl)phenyl)-3,3',5,5'-tetramethyl-1,1'-biadamantane 5.0 g obtained in Synthesis Example 1 was dissolved in toluene 95 g, tantalum (V) chloride 0.5 g was added, the mixture was reacted under dry nitrogen at 30° C. for 24 hours, the reaction solution was dropped into 10-fold the volume of methanol, and the precipitate was collected and dried to obtain a 3.5 g of a polymer. The molecular weight of the obtained polymer was found converted to polystyrene using a gel permeation chromatograph (GPC) made by Tohso Corporation, whereupon the weight average molecular weight was 82,500.

Synthesis Example 3

Synthesis of 7,7'-bis(3,5-diethynylphenyl)-3,3',5,5'-tetramethyl-1,1'-biadamantane The method described in Synthesis Example 1-3) was used to synthesize 7,7'-bis(3,5-dibromophenyl)-3,3',5,5'-tetramethyl-1,1'-biadamantane.

Next, 7,7'-bis(3,5-dibromophenyl)-3,3',5,5'-tetramethyl-1,1'-biadamantane 50 g (62.9 mmol), dichlorobistriphenylphosphine palladium 3.53 g (5.0 mmol), triphenylphosphine 6.60 g (25.2 mmol), copper (II) iodide 4.79 g (25.2 mmol), and triethylamine 750 ml were charged into a flask and stirred. The solution was raised in temperature to 75° C., the trimethylsilylacetylene 37.1 g (377.7 mmol) was gently added. The solution was stirred at 75° C. for 7 hours, then raised in temperature to 120° C. to distill off the triethylamine. The solution was returned to room temperature, then dichloromethane 1000 ml was added to the reaction solution and the result was stirred for 20 minutes. The precipitate in the reaction solution was removed by filtering, then 5% hydrochloric acid solution 1000 ml was added to the filtrate to separate it. The organic phase obtained by separation was rinsed by water 1000 ml three times, then the solvent of the organic phase was removed under reduced pressure to obtain a compound. The obtained compound was dissolved in hexane 1500 ml, the insolubles were removed by filtering, and the hexane of the filtrate was removed under reduced pressure. To the result, acetone 1000 ml was charged and the precipitate was rinsed by acetone three times to obtain 7,7'-bis(3,5-ditrimethylsilylethynylphenyl)-3,3',5,5'-tetramethyl-1,1'-biadamantane 43 g.

Further, the above obtained 7,7'-bis(3,5-ditrimethylsilylethynyl-phenyl)-3,3',5,5'-tetramethyl-1,1'-biadamantane 39.8 g (53.5 mmol) and potassium carbonate 1.46 g (10.6 mmol) were stirred in a mixed solvent of tetrahydrofuran 600 ml and methanol 300 ml under a nitrogen atmosphere at room temperature for 4 hours. The result was charged into a 10% hydrochloric acid solution 1000 ml, the precipitate was obtained by filtering, and the obtained precipitate was rinsed with water 1000 ml and further rinsed with acetone 1000 ml, then dried to obtain the product 21.2 g.

Below, the appearance of the product obtained above and the results of mass analysis and elemental analysis are shown. This data shows that the obtained compound is 7,7'-bis(3,5-diethynylphenyl)-3,3',5,5'-tetramethyl-1,1'-biadamantane.

Appearance: white solid
MS (FD) (m/z): 574 (M$^+$)
Elemental Analysis
Theoretical value (%): C, 91.93; H, 8.07
Measured value (%): C, 91.89; H, 8.11

Synthesis Example 4

7,7'-bis(3,5-diethynylphenyl)-3,3',5,5'-tetramethyl-1,1'-biadamantane 5.0 g obtained in Synthesis Example 3 was dissolved in anisole 45 g. The solution was reacted under dried nitrogen at 155° C. for 18 hours, the reaction solution was dropped into a 10 fold volume of methanol, then the precipitate was collected and dried to obtain 4.2 g of a polymer. The molecular weight of the obtained polymer was found converted to polystyrene using a gel permeation chromatograph (GPC) made by Tohso Corporation, whereupon the weight average molecular weight was 62,200.

Synthesis Example 5

Synthesis of 7,7'-bis(3,5-divinylphenyl)-3,3',5,5'-tetramethyl-1,1'-biadamantane To a 100 ml recovery flask, 7,7'-bis(3,5-diethynylphenyl)-3,3',5,5'-tetramethyl-1,1'-biadamantane 5.7 g (10 mmol) obtained in Synthesis Example 3, quinoline 19.4 g (150 mmol), 5% palladium-calcium carbonate 0.3 g (0.015 mmol), tetrahydrofuran (30 ml), and a stirrer were charged. The stirring was started under a hydrogen flow at room temperature. At the point of time when hydrogen 0.90 liter (40 mmol) was consumed, nitrogen was introduced to stop the reaction. The reaction solution was filtered, then the solvent was removed under reduced pressure. The obtained solid was purified by column chromatography to obtain the product 5.2 g.

Below, the appearance of the product and the results of mass analysis and elemental analysis are shown. This data shows that the obtained compound is 7,7'-bis(3,5-divinylphenyl)-3,3',5,5'-tetramethyl-1,1'-biadamantane.

Appearance: white solid
MS (FD) (m/z): 582 (M$^+$)
Elemental Analysis
Theoretical value (%): C, 90.66; H, 9.34
Measured value (%): C, 90.59; H, 9.41

Synthesis Example 6

7,7'-bis(3,5-divinylphenyl)-3,3',5,5'-tetramethyl-1,1'-biadamantane 5.0 g obtained in Synthesis Example 5 was dissolved in anisole 45 g. The solution was reacted under dried nitrogen at 155° C. for 24 hours, the reaction solution was dropped into a 10 fold volume of methanol, and the precipitate was collected and dried to obtain 3.2 g of a polymer. The molecular weight of the obtained polymer was found converted to polystyrene using a gel permeation chromatograph (GPC) made by Tohso Corporation, whereupon the weight average molecular weight was 129,200.

Synthesis Example 7

Synthesis of 1,4-bis[3-(3,5-diethynylphenyl)-1-adamantyl]benzene

The method described in the specification of U.S. Pat. No. 3,342,880 was used to synthesize 1,4-bis(adamantyl)benzene. A mixed solution of the obtained 1,4-bis(adamantyl)benzene 20 g (57.8 mmol), carbon tetrachloride 360 g, and bromine 244 g (1.53 mol) was stirred at 30° C. for 70 hours. The reaction solution was added to 300 g of ice water, then the unreacted bromine was reduced by sodium sulfite. After reduction, chloroform 120 g was added to the solution to separate it and the organic phase was rinsed with water. The organic phase was concentrated at 40° C., then was isolated by silica gel column chromatography to obtain 1,4-bis[3-bromo-1-adamantyl]benzene 5.5 g. Using the obtained 1,4-bis[3-bromo-1-adamantyl]benzene 5 g, 1,4-bis[3-(3,5-diethynylphenyl)-1-adamantyl]benzene 3.8 g was obtained by a similar method as in Synthesis Example 3.

Below, the appearance of the product and the results of mass analysis and elemental analysis are shown. This data shows that the obtained compound is 1,4-bis[3-(3,5-diethynylphenyl)-1-adamantyl]benzene.

Appearance: white solid
MS (FD) (m/z): 594 ($M^+$)
Elemental Analysis
Theoretical value (%): C, 92.93, H, 7.07
Measured value (%): C, 92.77, H, 7.23

Synthesis Example 8

1,4-bis[3-(3,5-diethynylphenyl)-1-adamantyl]benzene 3.0 g obtained in Synthesis Example 7 was reacted by the same method as disclosed in Synthesis Example 4 to obtain 2.1 g of a polymer. The molecular weight of the obtained polymer was found converted to polystyrene using a gel permeation chromatograph (GPC) made by Tohso Corporation, whereupon the weight average molecular weight was 98,000.

Synthesis Example 9

Synthesis of 9,9'-bis(3,5-diethynylphenyl)-4,4'-bidiamantane

1) Synthesis of 4,4'-bi(diamantane)

A four-neck 500 ml flask provided with a thermometer, stirrer, and reflux tube was charged with metal sodium 14 g (0.6 mol) and n-octane 600 ml and was cooled to an inside temperature of 0° C. While vigorously stirring, 4-bromodiamantane 80.2 g (0.3 mol) previously dissolved in n-octane 300 ml was gradually added dropwise. While dropping, the inside temperature was kept at 0° C. to 5° C. After the end of the dropwise addition, when the temperature no longer rose, the reaction was continued for 1 hour. After that, the reactant was poured into cold water 1500 ml, then the crude product was separated by filtration, rinsed with pure water, and dried. Further, the crude product was recrystallized by hot hexane. The obtained recrystallized product was dried under reduced pressure to obtain the product 78.6 g.

By IR analysis, absorption of the Br group (around 690 to 515 $cm^{-1}$) disappears. By mass analysis, the molecular weight is 374. From these results, the product was shown to be 4,4'-bi(diamantane).

2) Synthesis of 9,9'-dibromo-4,4'-bidiamantane

The 4,4'-bi(diamantane) obtained above was reacted by the same method as in Synthesis Example 1-2) to obtain 9,9'-dibromo-4,4'-bidiamantane 66.6 g.

By IR analysis, absorption of the Br group is found at 690 to 515 $cm^{-1}$. By mass analysis, the molecular weight is 530. From these results, the product was shown to be 9,9'-dibromo-4,4'-bidiamantane.

3) Synthesis of 9,9'-bis(3,5-diethynylphenyl)-4,4'-bidiamantane 9,9'-dibromo-4,4'-bidiamantane 60 g obtained above was reacted by the same method as in Synthesis Example 3 to synthesize 9,9'-bis(3,5-diethynylphenyl)-4,4'-bidiamantane 19.5 g.

Below, the appearance of the product and the results of mass analysis and elemental analysis are shown. This data shows that the obtained compound is 9,9'-bis(3,5-diethynylphenyl)-4,4'-bidiamantane.

Appearance: white solid
MS (FD) (m/z): 622 ($M^+$)
Elemental Analysis
Theoretical value (%): C, 92.56, H, 7.44
Measured value (%): C, 92.12, H, 7.30

Synthesis Example 10

9,9'-bis(3,5-diethynylphenyl)-4,4'-bidiamantane 5.0 g obtained in Synthesis Example 9 was reacted by the same method as in Synthesis Example 4 to obtain 4.0 g of a polymer. The molecular weight of the obtained polymer was found converted to polystyrene using a gel permeation chromatograph (GPC) made by Tohso Corporation, whereupon the weight average molecular weight was 77,000.

Synthesis Example 11

According to the method described in the literature (Journal of Polymer Science: Part A: Polymer Chemistry, Vol. 30, 1747-1754 (1992)), 3,3'-diethynyl-1,1'-biadamantane was synthesized. Next, 3,3'-diethynyl-1,1'-biadamantane 10 g, 1,3,5-triisopropylbenzene 50 ml, and Pd(PPh$_3$)$_4$ 150 mg were stirred under a nitrogen flow at 200° C. for 10 hours. The reaction solution was lowered to room temperature, the insolubles were filtered out, then isopropyl alcohol 300 ml was added to the filtrate and the precipitated solid was obtained by filtering and rinsed with isopropyl alcohol to obtain 2.8 g of a polymer. The molecular weight of the obtained polymer was found converted to polystyrene using a gel permeation chromatograph (GPC) made by Tohso Corporation, whereupon the weight average molecular weight was 20,000.

Synthesis Example 12

A 200 ml flask was charged with dibromoadamantane 5.0 g (17 mmol), aluminum bromide 2.3 g (9 mol), and m-dibromobenzene 100 ml and the mixture stirred at 60° C. for 10 hours. After cooling, the reaction solution was added to ice water 150 g in which concentrated hydrochloric acid 10 g was dissolved, the mixture was stirred, then the aqueous phase was removed. The excess dibromobenzene was removed by distillation under reduced pressure, then methylene chloride 100 ml was added to the residue to dissolve it, then the result was rinsed with water and saline, then dried with magnesium sulfate. The magnesium sulfate was filtered out, then the methylene chloride was concentrated by an evaporator and methanol 100 ml was added and the result stirred. The precipitated crystal was obtained by filtering and dried under reduced pressure. The crystal 6.0 g was charged into a 200 ml flask, dichlorobis(triphenylphosphine) palladium 200 mg, triphenylphosphine 400 mg, copper (I) iodide 180 mg, and triethylamine 100 ml were added, then the mixture was raised in temperature to 80° C. Trimethylsilylacetylene 6.7 g was dropped over one hour and a reaction caused at 80° C. for 4 hours. After cooling, the solvent was distilled off, diethyl ether 200 ml was added to the residue, and the insoluble salts were filtered off. The filtrate was rinsed with 1 mol/liter hydrochloric acid solution, saturated saline, and water and the ether phase was dried with magnesium sulfate. The desiccant was filtered out, the ether was distilled off, and the residue was purified by a column. The product 5.5 g was dissolved in methanol 150 ml and tetrahydrofuran 100 ml, potassium carbonate 0.5 g was added, and the result was stirred at room temperature for 4 hours. The solvent was distilled off under reduced pressure, methylene chloride 200 ml and 1 mol/liter hydrochloric acid 100 ml were added to the residue, then the mixture was stirred, then the hydrochloric acid phase was removed. The methylene chloride phase was rinsed with purified water 100 ml three times, the solvent was distilled off from the methylene chloride phase, then the residue was dried under reduced pressure to obtain bis(3,5-diethynylphenyl) adamantane 3.0 g. The bis(3,5-diethynylphenyl) adamantane was polymerized by the same method as in Synthesis Example 4, except for changing the solvent to anisole, at a reaction temperature of 150° C. to obtain a polymer. The molecular weight of the obtained polymer was found converted to polystyrene using a gel permeation chromatograph (GPC) made by Tohso Corporation, whereupon the weight average molecular weight was 120,000.

Synthesis Example 13

A 100 ml four-neck flask provided with a thermometer, stirrer, reflux tube, and nitrogen-introducing tube was charged with 2,2'-dimethylbiphenyl 14.7 g (80.55 mmol), 1-bromo-adamantane 34.7 g (161.1 mmol), and nitromethane 200 ml and the mixture stirred under a nitrogen flow at room temperature. Iron (III) chloride 1.31 g (8.07 mmol) was added and the result stirred at room temperature until dissolving. An oil bath was heated to 60° C., then the stirring was continued at that temperature for 4 hours. The reaction solution was filtered and rinsed away with a small amount of methanol. The filtered material was stirred in 30 ml of methanol for 30 minutes, then filtered. The obtained residue was dried at 60° C. under reduced pressure to obtain 2,2'-dimethyl-5,5'-bis(1-adamantyl)biphenyl white powder 17.5 g.

From the obtained 2,2'-dimethyl-5,5'-bis(1-adamantyl)-biphenyl 10 g, the same method as in Synthesis Example 7 was used to synthesize 2,2'-dimethyl-5,5'-bis(3-bromo-1-adamantyl)biphenyl 4.5 g, then the same method as in Synthesis Example 3 was used to obtain 2,2'-dimethyl-5,5'-bis(3-(3,5-diethynylphenyl)-1-adamantyl)biphenyl 3.8 g.

The above obtained 2,2'-dimethyl-5,5'-bis(3-(3,5-diethynylphenyl)-1-adamantyl)biphenyl 3 g was polymerized by the same method as in Synthesis Example 4 to obtain 2.5 g of a polymer.

Synthesis Example 14

(1) Synthesis of 3,3'''-dibromo-5,7,5',7',5'',7'',5''',7'''-octamethyl-1,1':3',1'':3'',1'''-tetraadamantane A mixture of tetra(dimethyl adamantane) 2.0 g (3.0 mmol), bromine 13.7 g (86.0 mmol), and carbon tetrachloride 500 ml was stirred under a nitrogen atmosphere at 50° C. for 8 hours. The reaction mixture was cooled to 5° C., water was added, then sodium hydrogen sulfite was gently added to reduce the excess bromine. After that, the precipitate was filtered, was successively rinsed with saturated sodium hydrogencarbonate solution, water, and acetone, and was dried. As a result, dibromotetra(dimethyladamantane) (=3,3'''-dibromo-5,7,5', 7',5'',7'',5''',7'''-octamethyl-1,1':3':3'',1'''-tetraadamantane) was obtained in 2.0 g (2.4 mmol) for a yield of 80%.

Below, the appearance of the product and the results of mass analysis and elemental analysis are shown. This data shows that the obtained compound is 3,3'''-dibromo-5,7,5',7', 5'',7'',5''',7'''-octamethyl-1,1':3',1'':3'',1'''-tetraadamantane.
Appearance: white solid
MS (FD) (m/z): 808 (M⁺)
Elemental Analysis
Theoretical value (%): C, 71.27, H, 8.97, Br, 19.76
Measured value (%): C, 71.23, H, 8.95, Br, 19.82

(2) Synthesis of 3,3'''-bis(3,5-dibromophenyl)-5,7,5', 7', 5'',7'',5''',7'''-octamethyl-1,1':3'':3'',1'''-tetraadamantane A 3-liter recovery flask was charged with the 3,3'''-dibromo-5,7,5',7',5'',7'',5''',7'''-octamethyl-1,1':3',1'':3'',1'''-tetraadamantane 80.9 g (100 mmol) obtained above, 1,3-dibromobenzene 1180 g (500 mmol), and a stirrer, then aluminum (III) bromide 26.7 g (100 mmol) was added little by little under a nitrogen flow at room temperature with stirring. After the end of addition, the solution was stirred at 50° C. for 7 hours. The reaction solution was charged into 1 mol/liter hydrochloric acid solution 2 liters, the aqueous phase was separated and removed, then acetone 1 liter was added for extraction. The solid was collected by filtering and dried under reduced pressure to obtain 3,3'''-bis(3,5-dibromophenyl)-5,7,5',7',5'',7'',5''',7'''-octamethyl-1,1':3',1'':3'',1'''-tetraadamantane 100.7 g (90.0 mmol; yield 90.0%)

Below, the appearance of the product and the results of mass analysis and elemental analysis are shown. This data shows that the obtained compound is 3,3'''-bis(3,5-dibromophenyl)-5,7,5',7',5'',7'',5''',7'''-octamethyl-1,1':3'''; 3'',1'''-tetraadamantane.
Appearance: white solid
MS (FD) (m/z): 1118 (M⁺)
Elemental Analysis
Theoretical value (%): C, 64.41, H, 7.03, Br, 28.57
Measured value (%): C, 64.34, H, 7.06, Br, 28.60

(3) Synthesis of 3,3'''-bis(3,5-bis(phenylethynyl) phenyl)-5,7,5',7',5'',7'',5''',7'''-octamethyl-1,1':3''':3'', 1'''-tetraadamantane Next, a 3-liter recovery flask was charged with 3,3'''-bis(3, 5-dibromophenyl)-5,7,5',7',5'',7'',5''',7'''-octamethyl-1,1':3'': 3'',1'''-tetraadamantane 55.9 g (50.0 mmol) obtained above, ethynylbenzene 40.9 g (400 mmol), dichlorobistriphenylphosphine palladium 3.5 g (5.0 mmol), copper (I) iodide 3.8 g (20.0 mmol), triphenylphosphine 5.2 g (20.0 mmol), triethylamine 1 liter, and a stirrer and the mixture was stirred under a nitrogen flow at 95° C. for 6 hours. The reaction solution was charged into acetone 1 liter, the precipitated solid was rinsed with 2 mol/liter hydrochloric acid solution 1 liter and acetone 1 liter, then the result was dried under reduced pressure to obtain 3,3'''-bis(3,5-bis(phenylethynyl) phenyl)-5,7,5',7',5'',7'',5''',7'''-octamethyl-1,1':3''':3'',1'''-tetraadamantane 54.2 g (yield 90%).

3,3'''-bis(3,5-bis(phenylethynyl)phenyl)-5,7,5',7',5'',7'', 5''',7'''-octamethyl-1,1':3',1'':3'',1'''-tetraadamantane 3 g obtained above was polymerized by the same method as in Synthesis Example 4 to obtain 2.5 g of a polymer.

Below, the appearance of the product and the results of mass analysis and elemental analysis are shown. These data show that the obtained compound is 3,3'''-bis(3,5-bis(phenylethynyl)phenyl)-5,7,5',7',5'',7'',5''',7'''-octamethyl-1,1':3''':3'',1'''-tetraadamantane.
Appearance: white solid
MS (FD) (m/z): 1204 (M+)
Elemental Analysis
Theoretical value (%): C, 91.79, H, 8.21
Measured value (%): C, 91.72, H, 8.28

Example 1

The polymer 3 g obtained in Synthesis Example 2 was dissolved in cyclohexanone 50 g and filtered with a filter having a pore size of 0.05 μm to prepare a coating solution. The coating solution was coated by a spin coater on a low resistance 4-inch silicon wafer, heated and baked on a 200° C. hot plate for 1 minute, then cured in a 400° C. oven for 30 minutes to obtain a uniform insulating film having a film thickness of 0.358 μm.

The insulating film obtained above was measured for film thickness by an n&k Analyzer 1500 made by n&k Technology Inc. Further, the permittivity of the film was measured by an Automatic Mercury Probe CV Measuring Device SSM495 made by SSM Japan K.K., the space size in the film was measured by positron lifetime spectroscopy, the elastic modulus of the film was measured by a Nanoindenter made by MTS Corporation, and the glass transition temperature (Tg) was measured by shaving off the film and using a DSC-Q1000 device made by TA Instruments. These results are shown in Table 1.

Examples 2 to 5

The polymers obtained in Synthesis Examples 4, 6, 8, and 10 were used in the same way as in Example 1 to prepare, coat, and cure coating solutions and obtain uniform insulating films. The permittivity, space size, glass transition temperature (Tg), and elastic modulus of the obtained insulating films were measured. These results are shown in Table 1.

Example 6

In the preparation of the coating solution in Example 1, as an adhesion promoter, 3-aminopropyl triethoxysilane was added to 3% of the mass of the polymer so as to prepare the coating solution. This coating solution was used in the same way as in Example 1 for coating and curing to obtain a uniform insulating film. The permittivity, space size, glass transition temperature (Tg), and elastic modulus of the obtained insulating film were measured. These results are shown in Table 1.

Examples 7 to 10

In each of the coating solutions in Examples 2 to 5, in the same way as in Example 6, as an adhesion promoter, 3-aminopropyl triethoxysilane was added to 3% of the mass of the polymer so as to prepare the coating solution. This coating solution was used in the same way as in Example 1 for coating and curing to obtain a uniform insulating film. The permittivity, space size, glass transition temperature (Tg), and elastic modulus of the obtained insulating films were measured. These results are shown in Table 1.

Comparative Examples 1 to 3

Polymers obtained in the Synthesis Examples 11 to 13 were used in the same way as Synthesis Example 1 to prepare, coat, and cure coating solutions so as to obtain uniform insulating films. The permittivity, space size, glass transition temperature (Tg), and elastic modulus of the obtained insulating films were measured. These results are shown in Table 1.

Comparative Example 4

It was attempted to dissolve the polymer 3 g obtained in the above Synthesis Example 14 in cyclohexanone 50 g, but the solubility was low and it was not possible to prepare a coating solution.

TABLE 1

|  | Permittivity | Space size (nm) | Tg (° C.) | Elastic modulus (GPa) |
| --- | --- | --- | --- | --- |
| Example 1 | 2.28 | 1.5 | >420 | 6.5 |
| Example 2 | 2.17 | 1.9 | >420 | 7.2 |
| Example 3 | 2.23 | 0.85 | >420 | 5.6 |
| Example 4 | 2.29 | 1.2 | >420 | 8.2 |
| Example 5 | 2.21 | 1.8 | >420 | 6.7 |
| Example 6 | 2.26 | 1.4 | >420 | 7.0 |
| Example 7 | 2.20 | 1.8 | >420 | 7.5 |
| Example 8 | 2.23 | 0.95 | >420 | 5.5 |
| Example 9 | 2.28 | 1.1 | >420 | 8.5 |
| Example 10 | 2.22 | 1.6 | >420 | 6.5 |
| Comparative Example 1 | 2.43 | 0.84 | >400 | 6.8 |
| Comparative Example 2 | 2.77 | 0.68 | >420 | 9.1 |
| Comparative Example 3 | 2.70 | 0.65 | >420 | 8.0 |

Table 1 shows that an insulating film obtained by the present invention gives a 2.3 or lower low permittivity and a high heat resistance. Further, the elastic modulus was 5 GPa or more in each case and was suitable as an insulating film.

Next, the interconnect signal delay was evaluated in order to evaluate the performance of the electronic device.

Example 11

A silicon substrate was prepared, a silicon nitride layer was formed on the silicon substrate, the coating solution obtained in Example 1 was used for spin coating to form a coated film of an insulating film of Example 1 on the silicon nitride layer, then the usual Single-Damascene method was used to form a single-layer interconnect structure of copper. That is, the photolithography method was used to etch and rinse an insulating film to form interconnect grooves, the PVD method was used to form a barrier metal and copper seed layer on the sides of the interconnect grooves, electroplating was used to deposit copper in the interconnect grooves to form the interconnect layer, CMP was used to planarize the surface, the CVD method was used was form a silicon nitride film and silicon oxide protective film, and aluminum interconnects were formed to prepare a sample for evaluation of the electrical characteristics of single copper layer interconnects. This sample was used to measure the copper interconnect resistance and interconnect capacity by a Prober UF-3000 made by Tokyo Seimitsu Co. Ltd., a Tester E5270A made by Agilent Technology, and an LCR meter 4284A also made by Agilent Technology. By what percent the product of the interconnect resistance (R) and interconnect capacity (C) was reduced from an SiOC film having a permittivity of 3.0 formed by CVD as the insulating film was evaluated. The results are shown in Table 2.

Examples 12 to 20

A method similar to Example 11 was used to form an insulating film using each of the coating solutions obtained in Examples 2 to 10 and prepare a sample for evaluation of the electrical characteristics of single copper layer interconnects. By what percent the product of the interconnect resistance (R) and interconnect capacity (C) was reduced from an SiOC film having a permittivity of 3.0 formed by CVD as the insulating film was evaluated. The results are shown in Table 2.

Comparative Examples 4 to 6

A method similar to Example 11 was used to form an insulating film using each of the coating solutions obtained in Comparative Examples 1 to 3 and prepare a sample for evaluation of the electrical characteristics of single copper layer interconnects. By what percent the product of the interconnect resistance (R) and interconnect capacity (C) was reduced from an SiOC film having a permittivity of 3.0 formed by CVD as the insulating film was evaluated. The results are shown in Table 2.

TABLE 2

|  | (R) × (C) reduction rate (%) |
|---|---|
| Example 11 | 19.2 |
| Example 12 | 22.5 |
| Example 13 | 20.0 |
| Example 14 | 18.3 |
| Example 15 | 25.7 |
| Example 16 | 20.4 |
| Example 17 | 16.8 |
| Example 18 | 17.3 |
| Example 19 | 19.6 |
| Example 20 | 20.2 |
| Comparative Example 4 | 1.0 |
| Comparative Example 5 | 1.5 |
| Comparative Example 6 | 0.0 |

From these results, due to the use of the insulating films obtained by the present invention, the interconnect signal delay was evaluated as being excellent.

INDUSTRIAL APPLICABILITY

According to the present invention, it is possible to provide a polymer and composition useful for forming an insulating film provided with all of low permittivity, high heat resistance, and high mechanical strength. The insulating film obtained from the polymer and composition is excellent in heat resistance, mechanical properties, and electrical properties and especially is low in permittivity, so an electronic device using the same can be decreased in signal delay.

The invention claimed is:

1. A polymer for forming an insulating film obtained by polymerizing a reactive compound represented by Formula (3'):

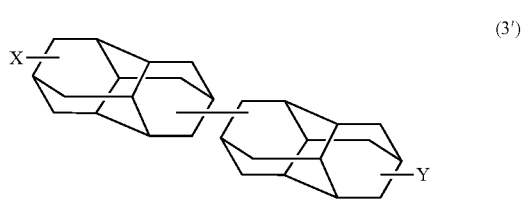

wherein X and Y are the same or different from each other and respectively represent an aromatic organic group having two or three reactive groups respectively having a carbon-carbon unsaturated bond.

2. The polymer for forming an insulating film according to claim 1, wherein the polymerization of the polymer is a thermal polymerization causing the reactive compound to react under a catalyst-free condition.

3. A composition for forming an insulating film comprising a polymer for forming an insulating film according to claim 1.

4. The composition for forming an insulating film according to claim 3, further including an adhesion promoter.

5. An insulating film formed using the composition for forming an insulating film according to claim 3 or 4, wherein said insulating film has molecular spaces having an average space size of 0.8 nm to 5 nm and has a permittivity of 2.3 or less.

6. An electronic device having an insulating film according to claim 5.

* * * * *